United States Patent [19]

Kiriseko

[11] Patent Number: 4,896,034
[45] Date of Patent: Jan. 23, 1990

[54] METHOD OF IDENTIFYING A SEMICONDUCTOR WAFER UTILIZING A LIGHT SOURCE AND A DETECTOR

[75] Inventor: Tadashi Kiriseko, Kanagawa, Japan

[73] Assignee: Fujitsu Limited, Kawasaki, Japan

[21] Appl. No.: 254,100

[22] Filed: Oct. 6, 1988

[30] Foreign Application Priority Data

Oct. 9, 1987 [JP] Japan .............................. 62-255242

[51] Int. Cl.⁴ ............................................ G06K 7/10
[52] U.S. Cl. .................................. 250/271; 250/338.1
[58] Field of Search ............ 258/271, 568, 566, 338.1, 258/341

[56] References Cited

U.S. PATENT DOCUMENTS 4,368,979 1/1983 Ruell .................................... 250/271
4,825,093 4/1987 Kiriseko et al. .................... 250/568

Primary Examiner—Carolyn E. Fields
Assistant Examiner—David P. Porta
Attorney, Agent, or Firm—Staas & Halsey

[57] ABSTRACT

Automatic identification of each semiconductor wafer during wafer processing is achieved by the invention regardless of layers deposited on a code pattern. The code pattern, preferably, a bar code pattern, is formed on a front surface of the semiconductor wafer, and a light beam including infrared rays is irradiated onto a bottom surface thereof. The infrared rays easily penetrate through the silicon wafer and reflect from the bar code pattern formed on the front surface of the wafer. The reflected beam of infrared rays is received by a detector disposed on a back side of the wafer, and each wafer is identified by decoding the received signal. The bar code pattern can be directly formed by inscribing the wafer surface by a laser beam or inscribing a metal layer deposited thereon.

18 Claims, 5 Drawing Sheets

METHOD OF IDENTIFYING A SEMICONDUCTOR WAFER UTILIZING A LIGHT SOURCE AND A DETECTOR

BACKGROUND OF THE INVENTION

1. Field of the Invention

The present invention relates to a method of identifying a semiconductor wafer during fabrication processes by irradiating infrared rays onto a back side of the wafer and receiving the reflected rays from a code pattern formed on a front surface thereof.

2. Description of the Related Art

In one known method of identifying a semiconductor wafer a code pattern is formed on a front surface of a wafer and light is irradiated on a front side thereof and the reflected light from the code pattern is received on the front side. By this conventional method, when a plurality of layers is deposited on the code pattern, it becomes difficult to discriminate the code signal from the reflected light.

In mass production of semiconductor devices of a specific kind, a method of lot production control is generally applied, wherein a plurality of wafers is subjected to a collective production control using the same lot number. In this case, there is no need for identifying each wafer, and a lot number is given to a carrier or container carrying a plurality of wafers.

However, when producing a small quantity of integrated circuits such as ASIC (Application Specific Integrated Circuits) or gate array integrated circuits, each wafer must be identified during the whole fabrication process.

In the known method of identifying each wafer, a code pattern, such as numeral or character marks, or preferably a bar code pattern, is formed by etching a silicon surface utilizing photolithographic technology or inscribing the surface with a laser beam.

A bar code pattern is usually formed in a peripheral region near an orientation flat edge of a silicon wafer. FIG. 1 shows schematically a cross-section taken along a line crossing the bar code pattern. The bar code pattern 22 is formed on a surface 21a of a silicon wafer 21 by inscribing and roughing the silicon surface with a laser beam. A light source 23 is provided on the front side of the wafer and irradiates a light beam 24 onto the bar code pattern. A reflected light beam 25 is received by a photodetector 26. By sweeping the light beam 24 over the bar code pattern 22, the bar code pattern is decoded and the wafer is identified.

The principle of the above-described method is relatively simple. The reflection from an original surface 21a of the wafer, which is not inscribed by the laser beam, is regular and stronger in a direction towards the photodetector 26, which is aligned in a direction according to the law of reflection. However, the reflection from the bar code pattern 22 is irregular and weak. When the output signal from the photodetector is subjected to a slice circuit, the circuit can selectively output a pulse signal corresponding to the bar code pattern.

The above method creates some problems which need to be solved. For example, the surface area where the code pattern is formed is subjected to wafer processes many times simultaneously with fabrication processes for the other remaining wafer area where active elements are formed. The processes include a depositing process of insulating or metal layers, chemical or physical etching processes, heating processes, etc. Also, when the difference in strength between reflected light from the code pattern and that from the wafer surface becomes smaller due to the deposited layers, a signal of the code pattern is difficult to discriminate.

In an extreme case, such as when a metal layer is deposited on an area of the code pattern, identification becomes impossible without removing the metal layer. FIG. 2 illustrates schematically a cross-section of the wafer 21, on which an insulating layer 31, a metal layer 32 of aluminum alloy, and a protective layer 34 are deposited on an area of the code pattern 22. A window 33 is formed in the metal layer 32 in order to allow the incident light beam 24 to impinge upon the surface of the wafer 21. Even if the window is formed, the intermediate layers (such as 31 and 34) disturb transmission of the incident and reflected light beams, resulting in a decrease of contrast between the reflected light from the code pattern and that from the wafer surface.

In order to solve the above problem, a method for identifying a wafer has been proposed in which a bar code pattern is formed in a metal layer, infrared rays are irradiated onto one side of the wafer, and transmitted rays through the wafer and the bar code pattern are received on the other side thereof. The method is described in U.S. patent application Ser. No. 051,398 on May 19, 1987 by T. Kiriseko et al. and T. Kiriseko, the later being the inventor of the present application.

Another method for identifying a wafer which attempts to avoid the above-described problem, is one in which a bar code pattern is formed on a bottom surface of the wafer and both a light source and a detector for receiving the reflected light are placed on the bottom side of the wafer, thus avoiding the effects of deposited layers on the front surface of the wafer. U.S. Pat. No. 4,010,355 to K. E. Roehrman et al. describes this type of method.

The method which involves forming the code pattern on the bottom surface of the wafer has some problems. One problem is that, when the code pattern is formed by inscribing the wafer surface by a laser beam and evaporating silicon material, silicon material is likely to build up on a peripheral portion of the pattern, thus deteriorating the flatness of the bottom surface. This in turn creates a defocusing problem in the photolithographic process for the front surface. Another problem is that when the bottom surface of the wafer is subjected to a grinding process before it is separated into chips for sealing into a package, the code pattern is erased.

SUMMARY OF THE INVENTION

An object of the present invention is to provide a method of identifying a semiconductor wafer which is effective even when a code pattern is formed on a front surface of the wafer and a plurality of layers is deposited thereon during wafer processing.

Another object of the invention is to provide a method of identifying a semiconductor wafer including the steps of forming a code pattern on a front surface of the wafer, irradiating infrared rays onto a rear surface of the wafer, and receiving the reflected infrared rays from the rear thereof, uninhibited by layers deposited on the code pattern.

Still another object of the invention is to provide a method of identifying a semiconductor wafer which maintains a surface flatness on a back side of the wafer without laser inscribing the surface of the wafer and forms a code pattern on a front side thereof.

The foregoing and related objects are accomplished by the invention which is a method including the steps of forming a code pattern on a front surface of the wafer, irradiating infrared rays onto a back side thereof, receiving infrared rays penetrating through the wafer and reflected from the back side of the code pattern, detecting the received rays, and identifying the wafer. The code pattern is formed near an orientation flat edge of the wafer and includes first and second regions. A level of light intensity reflected from the first and second regions and received by the detector is different from each other. In a practical application, the code pattern is formed by directly inscribing a wafer surface by a laser beam at an initial stage of wafer processing or may be formed in a metalization layer by laser inscribing or by a photolithographic method during a subsequent stage of wafer processing.

A bar code pattern is more preferable than the code pattern using numerals or characters because of simplicity in automatic identification.

Further objects and advantages of the present invention will be apparent from the following description, reference being had to the accompanying drawings wherein like reference numerals refer to like parts throughout.

DETAILED DESCRIPTION OF THE PREFERRED EMBODIMENTS

Figure 1:
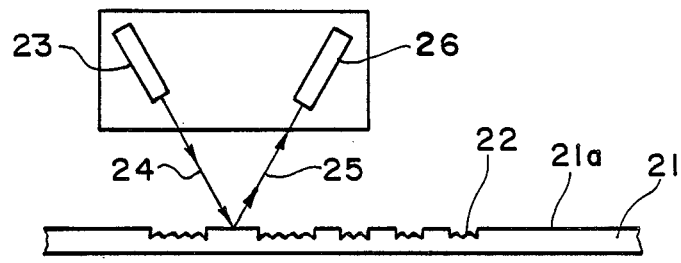
FIG. 1 is a schematic side view illustrating a known method of identifying a semiconductor wafer.
Figure 2:
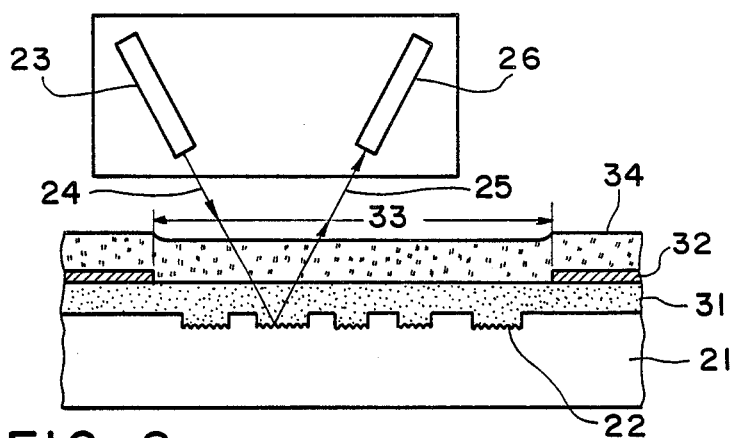
FIG. 2 is a schematic cross-sectional view of a semiconductor wafer illustrating how the method shown in FIG. 1 is applied to actual wafer processing.
Figure 3:
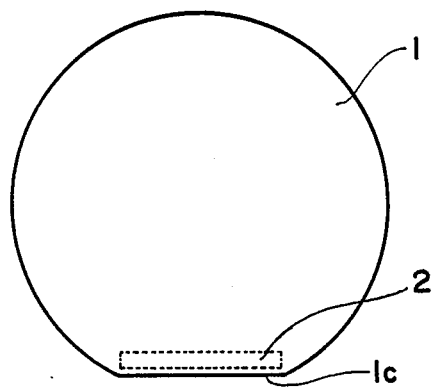
FIG. 3 is a top view of a semiconductor wafer illustrating a position of a code pattern on the wafer according to the present invention.

FIG. 3 is a top view of a wafer illustrating where a code pattern is formed. A circular wafer 1 has a flat edge 1c for orientation of the wafer. The code pattern 2 is formed in a region on the wafer surface near the orientation flat edge 1c substantially parallel thereto.

Figure 4:
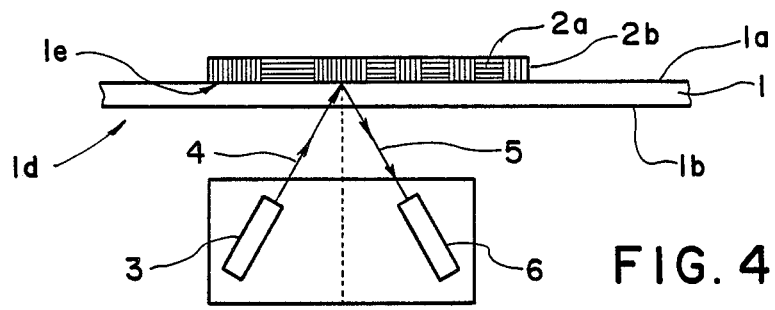
FIG. 4 is a schematic cross-sectional view of a semiconductor wafer and method of identifying the same according to the present invention.
Figure 5:
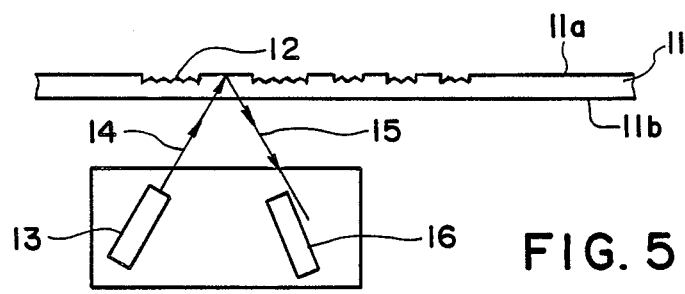
FIG. 5 is a schematic cross-sectional view of a semiconductor wafer and method of identifying the same according to another embodiment of the present invention.

FIGS. 4 and 5 show schematically a cross-section of the wafer 1 for explaining the principle of the invention. In FIG. 4, the code pattern is formed by two different materials 2a and 2b deposited on the upper surface 1a of the wafer 1, the two materials having a different reflectance. In a preferred embodiment, one material is an aluminum alloy and the other is an insulating material, such as silicon dioxide. A light source 3 is provided on a back side 1d of the wafer 1 and irradiates an incident beam 4 of infrared light rays onto the bottom surface 1b of the wafer 1. Infrared light rays, the wavelength thereof being longer than 1.3 μm, easily penetrate and transmit through a silicon substrate. Therefore, the infrared beam penetrates into the silicon wafer 1 and reflects from an interface 1e between the wafer and the deposited layers 2a or 2b. When the deposited material is an aluminum alloy, a larger reflection of infrared rays is expected than from the other material. Reflected rays are received by a detector 6 and generate a signal having a difference in the signal level depending on the material of the deposited layer.

FIG. 5 is a cross-sectional view for explaining the principle of another embodiment of the present invention, wherein a code pattern 12 is formed by inscribing an upper surface 11a of a silicon wafer 11 by a laser beam. When the upper surface 11a is inscribed by the laser beam, the silicon material evaporates and the inscribed area is made rough. This results in the code pattern 12 in FIG. 5. When the incident beam 14 from a light source 13 including infrared light rays is irradiated onto the back surface 11b of the wafer 11, reflection from the silicon surface not subjected to laser inscribing is stronger than that of the inscribed area of the code pattern 12. The direction of the reflected beam 15 for the former follows, in an ideal case, the law of reflection. However, the reflection for the latter is irregular. Therefore, if the axis of the detector 16 for receiving the reflected infrared light rays is tilted from an axis for receiving the rays of regular reflection, the detector 16 substantially generates a signal corresponding to the irregular reflection from the code pattern area 12.

As the light sources 3 or 13 of FIGS. 4 or 5, a tungsten lamp which generates both visible and infrared light rays, a helium-neon gas laser which abundantly includes 3.39 μm infrared rays, or many other kinds of semiconductor LEDs and lasers may be used. As the detectors 6 or 16, a CCD sensor which includes a plurality of sensing elements can be utilized. The CCD sensor is incorporated within an optical system and forms the detector 6 or 16. The output signal from the detector is subjected to a slice circuit and is converted to the signal corresponding to the code pattern (details are omitted in the FIGS.).

In actual production of integrated circuits, the method illustrated in FIG. 5 is suitable for the case where each wafer is to be identified from an initial stage of the wafer processing. However, the method illustrated in FIG. 4 is suitable for the case where a plurality of wafers is collectively subjected to the same bulk wafer processing before the first metalization process. In this case, it is not necessary to identify each wafer but it is sufficient to identify each lot of wafers collectively processed until that time. Thereafter, a code pattern is formed in the metal layer for identification of each wafer. The latter case is especially important for manufacturing ASICs or gate array integrated circuits, in which the patterning process of the metal layer is performed after receiving each customer's specifications.

Figure 6:
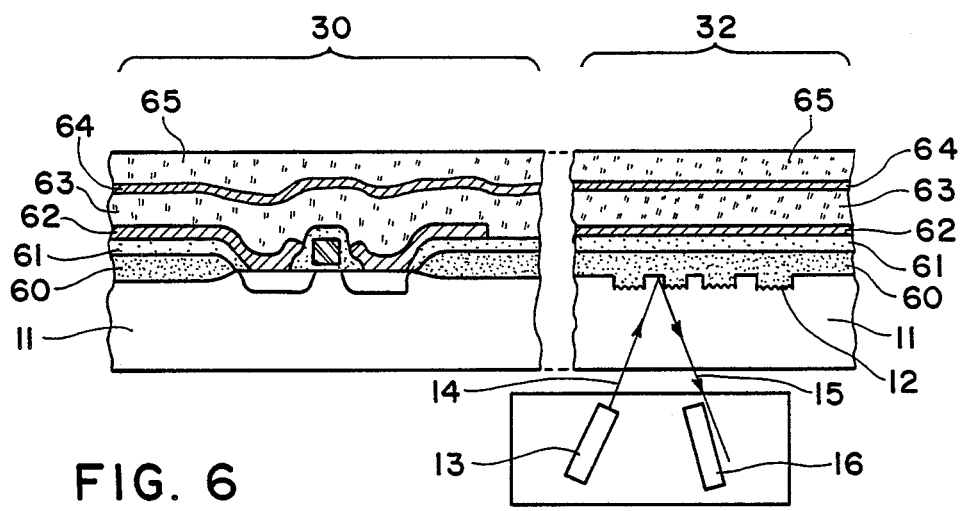
FIG. 6 is a schematic cross-sectional view of a semiconductor wafer using the method of FIG. 5, wherein a MOSFET is formed on the semiconductor wafer and a plurality of layers is deposited on the code pattern.

FIG. 6 shows a cross-section of a wafer when the method according to FIG. 5 is applied to actual fabrication of integrated circuits, wherein a plurality of MOSFETs are formed as an active element in an active region on the wafer and two-level metal layers are required for the MOSFET. A first region 30 shows partly a cross-section of a forming area for active elements, and a second region 32, a forming area of a code pattern near an orientation flat edge of the wafer. Generally, a bar code pattern is utilized as the code pattern for convenience of automatic forming and recognition.

Figure 7:
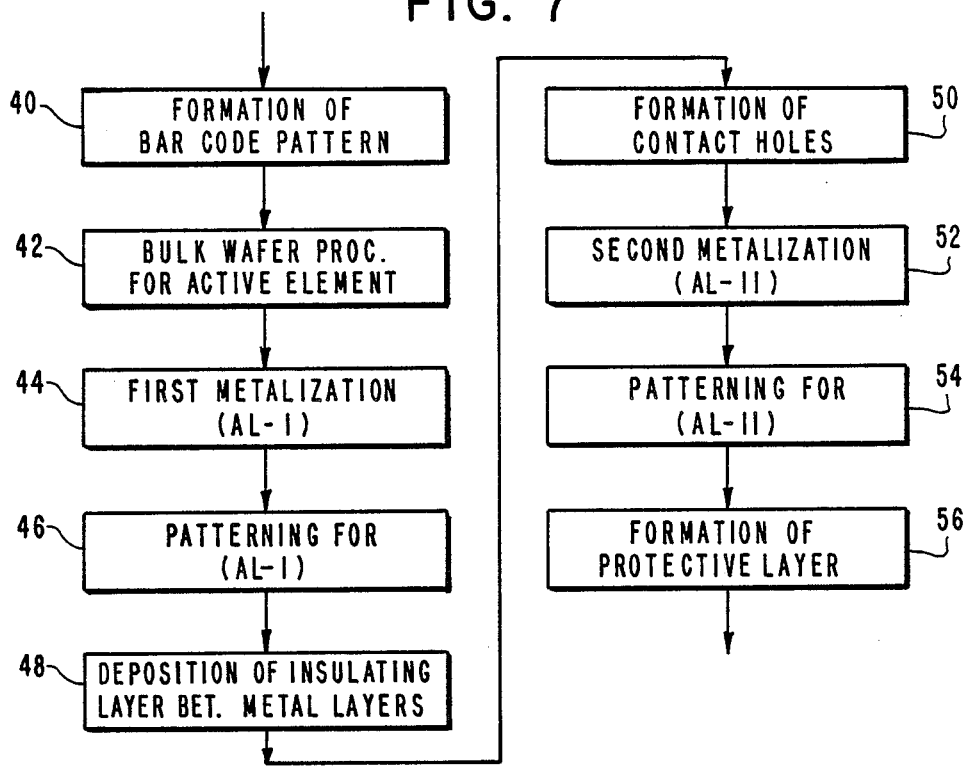
FIG. 7 is a flow chart of wafer processing, showing the subsequent steps after forming the code pattern and thus forming the semiconductor wafer illustrated in FIG. 6.

FIG. 7 is a flow chart for obtaining the structure of FIG. 6. In the flow chart, most steps not related directly with the identification of the wafer are omitted and the steps related to the laminated layers on the second region 32 are shown. The bar code pattern 12 is formed on a wafer 11 at an initial stage before wafer processing shown as step 40. Next, the wafer is subjected to a step 42 of bulk wafer processing until a first metalization step 44 is implemented. In step 42, most steps of forming an active element, in this case a MOSFET, are performed by conventional steps. During the step 42, a thermally oxidized layer of $SiO_2$ 60 and a CVD (Chemical Vapor Deposition) layer of $SiO_2$ 61 are laminated on the bar code pattern 12 in the second region 32 as shown in FIG. 6. The wafer is then subjected to a first metalization step (AL-I) 44 and a metal layer 62 of, for example, aluminum alloy is deposited thereon. The metal layer 62 in the first region 30 is patterned in step 46. An insulating layer 63 of, for example, PSG is formed in step 50, and a second metal layer 64 (AL-II) is deposited in step 52 and patterned in step 54. Finally, a protective layer 65 is formed on the wafer in step 56.

Every time that the wafer is required to be o identified during the above steps, a light source 13 of infrared light rays disposed on the back side of the wafer irradiates an incident beam 14 onto the bar code pattern 12 in the second region 32 from the back side. Because the bar code pattern is formed by laser inscribing, the inscribed surface of the silicon wafer becomes a scabrous or roughened surface. Therefore, the incident and penetrating light beam 14 reflects irregularly through the wafer. On the contrary, the reflection from a surface other than the inscribed area is regular and follows the optical law of reflection, meaning that the angle of reflection is predictable. Therefore, when an optical axis of a detector 16 is tilted from a direction for receiving the regular reflection light, the detector received no light of regular reflection. However, the detector can receive the reflected light from the bar code pattern.

The above method is not affected by the laminated layers on the bar code pattern. In the previously used technology, where a light source and a detector are disposed on the front side of the wafer, the bar code pattern cannot be detected because of the existence of metal layers. The metal layer nearly reflects the incident light, except in the case where a window is formed in the metal layer over the bar code pattern. However, when the present invention is applied, the bar code pattern can be identified regardless of the surface conditions of the wafer in the second region 32.

Figure 8:
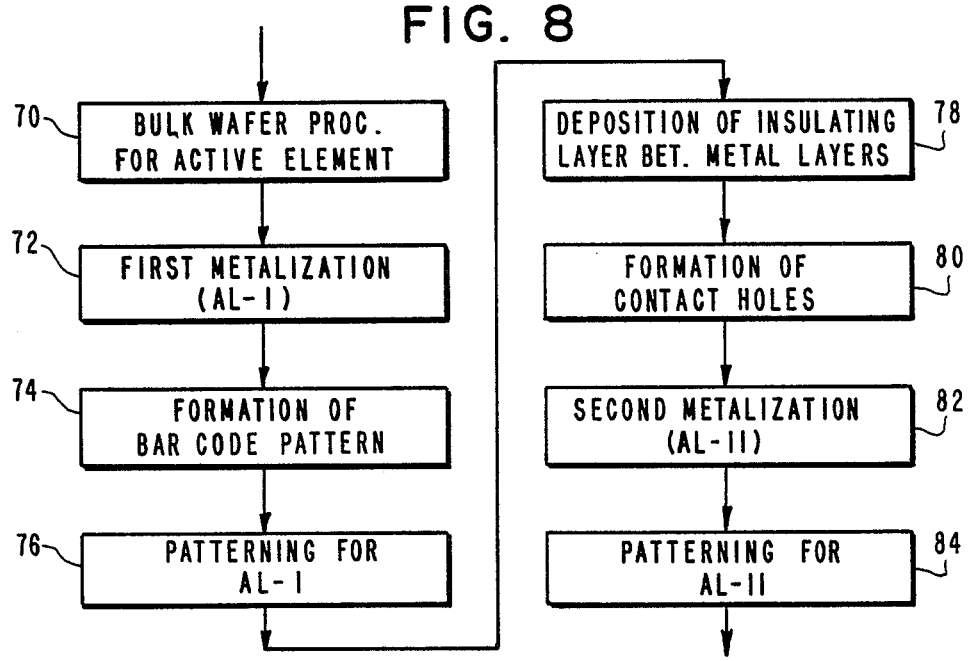
FIG. 8 is another flow chart of wafer processing, showing the steps which precede and follow the step of forming the code pattern, thereby forming the code pattern in a metal layer according to the method of FIG. 4.
Figure 9:
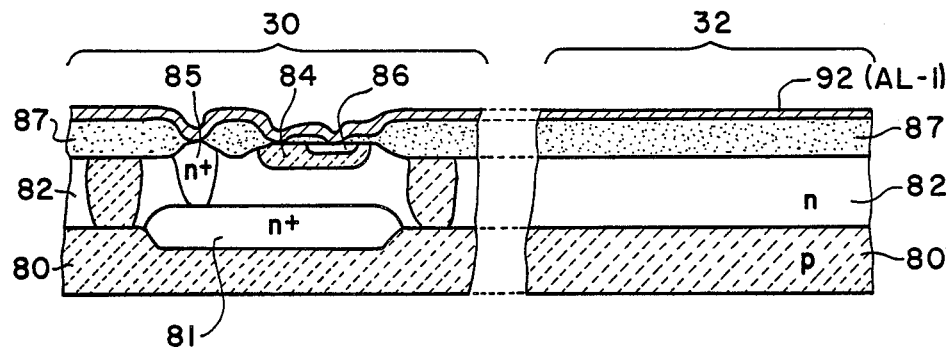
FIGS. 9 to 12 show schematical cross-sectional views at various steps during wafer processing and corresponding to the flow chart of FIG. 8, wherein the code pattern region is subjected to plural deposition processes for forming a bipolar transistor.

Another preferred embodiment which is applied when manufacturing integrated circuits, such as gate array integrated circuits, according to another embodiment of the method of the present invention, is explained with reference to FIGS. 8 to 12. The embodiment is related to the method of FIG. 4. FIG. 8 is a flow chart similar to FIG. 7, wherein the bar code pattern is formed in a first metal layer (AL-I). FIGS. 9 to 12 show a cross-sectional views corresponding to specific steps in the flow chart of FIG. 8. A bipolar transistor is formed in a first region 30, and the bar code pattern is formed in a second region 32. FIG. 9 shows a cross-section of the wafer when a step 70 of bulk wafer processing for forming a bipolar transistor and a first metalization step 72 are finished. A p-type silicon wafer 80 and an n-type epitaxial layer 82 form a silicon substrate. An insulating layer 87 of thermally oxidized $SiO_2$ and a first metal layer 92 (AL-I) are formed thereon in the second region 32. At this time, collector layers 81 and 85, a base region 84, and emitter region 86 are formed in the first region 30. The processes therefor are conventional, and details thereof are omitted.

Figure 10:
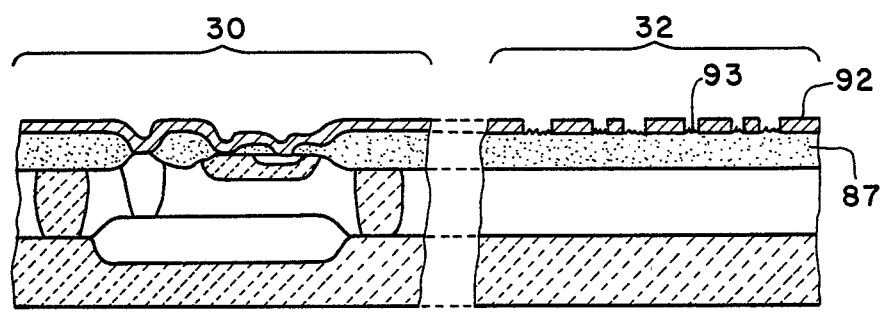
Figure 11:
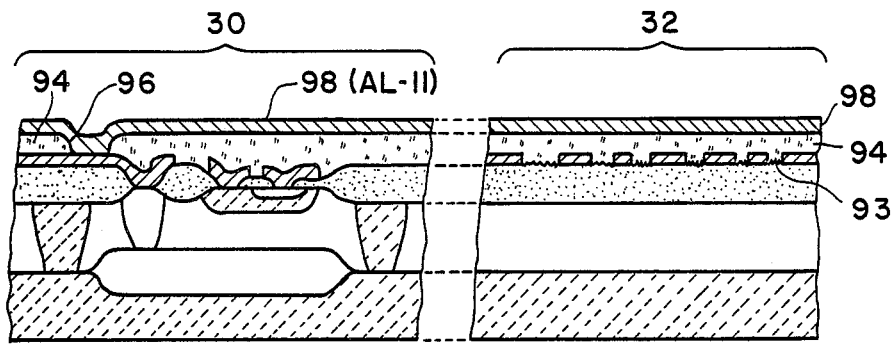
Figure 12:
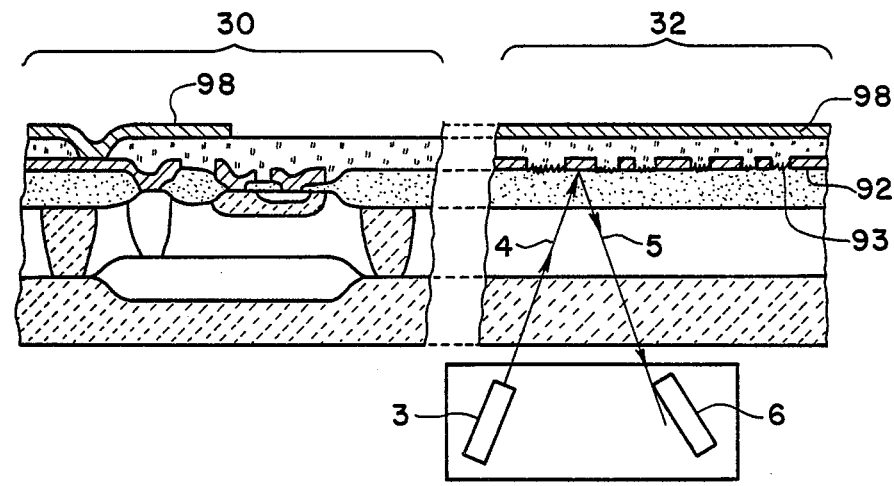

After forming the first metal layer 92, the metal layer in the second region 32 is subjected to a step 74 of forming the bar code pattern by laser inscribing, thereby forming the inscribed pattern 93 which is the bar code pattern. When the metal layer 92 is inscribed by a laser beam, the metal evaporates and the exposed surface of the insulating layer 87 becomes scabrous and roughened as shown in FIG. 10. Thereafter, the metal layer 92 in the first region 30 is patterned in a step 76, thus forming a wiring layer. The entire surface of the wafer is covered by an insulating layer 94 in a step 78, and contact holes 96 are formed in the first region 30 (step 80). A second metal layer 98 (AL-II) is deposited thereon (step 82) as shown in FIG. 11. Finally, the second metal layer 98 is patterned in a step 84 as shown in FIG. 12.

The second embodiment is especially suitable for manufacturing gate array integrated circuits, whereby identification of each wafer is not necessary before step 72 of FIG. 8. However, identification of each wafer is required in subsequent steps 76 and 84 because a different patterning mask is needed depending on a customer's individual requirements. When the wafer is required to be identified during the above steps 76 and 84, a light source 3 generating infrared light rays and disposed on the back side of the wafer irradiates an incident beam 4 onto the bar code pattern 93 in the second region 32 from the back side. Because the bar code pattern is formed by laser inscribing, it removes the metal layer 92 and inscribes the surface of the lower layer thereof. The inscribed surface is a scabrous or roughened surface, and thus, the incident and penetrating infrared light rays reflect irregularly. On the contrary, reflection from a back surface of the metal layer 92 is regular. Therefore, when an optical axis of a detector 6 deviates from a direction for receiving the regular reflection light, the detector receives no regular reflected light. However, the detector receives the irregularly reflected light from the bar code pattern 93.

The detector may be disposed with its optical axis being coincident with a direction of receiving the regular reflection light. In this case, the detected light reflected from the bar code pattern is weaker than that from the metal layer. However, the signal of the bar code pattern can also be discriminated.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description. Moreover, all changes which come within the meaning and range of equivalence of the claims are, therefore, to be embraced therein.

What we claim is:

1. A method of identifying a semiconductor wafer having a front surface, a rear surface, and a rear side, in which a light source transmits an incident light and a light detector having an optical axis receives a reflected light, said method comprising the steps of:
   (a) forming a code pattern on the front surface of said wafer, said code pattern having first and second regions, each having a reflected light intensity different from each other;
   (b) irradiating light from said light source including infrared light rays onto the rear surface of the wafer from the rear side of said wafer, said light penetrating through said wafer onto the code pattern and reflecting therefrom;
   (c) receiving the light reflected from the code pattern with said detector on the rear side of the wafer; and
   (d) identifying the wafer by decoding the received signal.

2. A method for identifying a semiconductor wafer according to claim 1, wherein said forming step comprises inscribing and roughing the front surface of the semiconductor wafer by a laser beam.

3. A method for identifying a semiconductor wafer according to claim 1, wherein said forming step comprises depositing a metal layer on the front surface of the semiconductor wafer and inscribing and evaporating said metal layer and roughing said metal layer by a laser beam.

4. A method for identifying a semiconductor wafer according to claim 1, further comprising forming an active element on the front surface of the semiconductor wafer.

5. A method for identifying a semiconductor wafer according to claim 1, wherein said forming step comprises forming a bar code pattern.

6. A method for identifying a semiconductor wafer according to claim 1, wherein said semiconductor wafer has a flat orientation edge and wherein said forming step comprises forming a code pattern in a region near the flat orientation edge of the semiconductor wafer.

7. A method for identifying a semiconductor wafer according to claim 2, further comprising depositing a plurality of layers including an insulating layer and a metal layer on the front surface of the semiconductor wafer on said code pattern after the forming step.

8. A method for identifying a semiconductor wafer according to claim 7, further comprising forming an active element on the front surface of the semiconductor wafer and depositing said metal layer as a first metal layer of said active element.

9. A method for identifying a semiconductor wafer according to claim 1, further comprising tilting the optical axis of said detector for receiving the reflected light from a direction for receiving reflected light corresponding to the incident light of the reflection so that the reflected light from the inscribed area is stronger than that from a non-inscribed area.

10. A method for identifying a semiconductor wafer according to claim 1, further comprising setting the optical axis of said detector for receiving the reflected light to be coincident with a direction for receiving reflected light corresponding to the incident light so that the reflected light from the inscribed area is weaker than that from a non-inscribed area.

11. A method for identifying a semiconductor wafer according to claim 2, further comprising forming an active element on the front surface of the semiconductor wafer.

12. A method for identifying a semiconductor wafer according to claim 3, further comprising forming an active element on the front surface of the semiconductor wafer.

13. A method for identifying a semiconductor wafer according to claim 2, wherein said forming step comprises forming a bar code pattern.

14. A method for identifying a semiconductor wafer according to claim 3, wherein said forming step comprises forming a bar code pattern.

15. A method for identifying a semiconductor wafer according to claim 2, wherein said semiconductor wafer has a flat orientation edge and wherein said forming step comprises forming a code pattern in a region near the flat orientation edge of the semiconductor wafer.

16. A method for identifying a semiconductor wafer according to claim 3, wherein said semiconductor wafer has a flat orientation edge and wherein said forming step comprises forming a code pattern in a region near the flat orientation edge of the semiconductor wafer.

17. A method for identifying a semiconductor wafer according to claim 2, further comprising tilting the optical axis of said detector for receiving the reflected light from a direction for receiving reflected light corresponding to the incident light of the reflection so that the reflected light from the inscribed area is stronger than that from a non-inscribed area.

18. A method for identifying a semiconductor wafer according to claim 2, further comprising tilting the optical axis of said detector for receiving the reflected light from a direction for receiving reflected light corresponding to the incident light of the reflection so that the reflected light from the inscribed area is stronger than that from a non-inscribed area.

* * * * *